(12) United States Patent
Peng

(10) Patent No.: US 6,516,290 B1
(45) Date of Patent: Feb. 4, 2003

(54) METHOD FOR MEASURING THE NONLINEARITY OF AN ANALOG FRONT END SYSTEM

(75) Inventor: Yung-Chow Peng, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/378,619

(22) Filed: Aug. 20, 1999

(51) Int. Cl.[7] .............................................. H04B 15/00
(52) U.S. Cl. ...................................... 702/198; 341/110
(58) Field of Search ................................. 702/198, 199, 702/189, 190, 191, 195, 197, 126; 327/21, 22; 341/3, 4, 50, 58, 75, 76, 110, 118, 120, 126, 138, 143

(56) References Cited

U.S. PATENT DOCUMENTS

| | | | |
|---|---|---|---|
| 4,352,160 A | 9/1982 | Frech et al. ................. 702/109 |
| 5,712,633 A | 1/1998 | Bae ............................. 341/120 |
| 6,252,900 B1 | * 6/2001 | Liu et al. ..................... 375/219 |

* cited by examiner

Primary Examiner—Marc S. Hoff
Assistant Examiner—Edward Raymond
(74) Attorney, Agent, or Firm—Birch, Stewart, Kolasch & Birch, LLP

(57) ABSTRACT

A method for accurately measuring the integral nonlinearity (INL) and differential nonlinearity (DNL) of an analog front end (AFE) system, such as an analog/digital converter (ADC), is provided. In particular, the method eliminates the need for well-calibrated equipment and an accurate signal source. Differing from conventional approaches, according to the invention, the INL of the AFE system is obtained by directly transferring the output of the AFE system rather than by accumulating the DNL. Therefore, the INL of the measured AFE system according to the invention is only slightly affected by inputted signal source.

42 Claims, 11 Drawing Sheets

METHOD FOR MEASURING THE NONLINEARITY OF AN ANALOG FRONT END SYSTEM

FIELD OF INVENTION

The present invention relates to a method for measuring the nonlinearity of an analog front end (AFE) system, such as an analog/digital converter (ADC), and more in particular, to a method for measuring accurately the differential nonlinearity (DNL) and integral nonlinearity (INL) of an AFE system.

BACKGROUND OF INVENTION

With respect to the conversion characteristic of an AFE system, e.g., an ADC, the DNL and INL both are very important specifications. Conventional methods usually utilize an accurate signal source to first measure the DNL of an AFE system. Afterwards, the INL of the AFE system is obtained by accumulating the DNL of the AFE system. Related prior arts refer to the following:

1. U.S. Pat. No. 4,352,160;
2. U.S. Pat. No. 5,712,633;
3. "Mixed-signal Testing Tutorial Class Notes," at European test conference, Rotterdam, on Apr. 19, 1993.

Hereinafter, the disadvantages of the conventional approaches will be described.

Note that an accurate signal source is necessary for the conventional approaches. When an inaccurate signal source is employed to measure the DNL and INL of an AFE system, it will introduce error into the DNL and INL. The DNL with little error induced by the inaccurate signal source may be permitted. However, the error of INL, which accumulates that of the DNL into a large value, can not be negligible. Therefore, only permissible DNL but no permissible INL can be obtained for an AFE system when an inaccurate signal source is employed to measure the nonlinearity of the AFE system.

Besides, shifted reference voltage existing in the signal source and/or poor-calibrated AFE system will induce D.C. drifts which makes the measured DNL diverge from accurate DNL. Furthermore, in conventional approaches, the computed INL of the AFE system by accumulating the inaccurate DNL will diverge from accurate INL more.

The foregoing and other state-of-the-art approaches for measuring the DNL and INL of an AFE system indicate the need for a new method of providing accurate DNL and INL measurements of the AFE system that can be implemented without the requisite of well-calibrated equipment and a high-accuracy signal source. It is also desirable that the measurements be immune to D.C. drifts induced by the signal source and/or AFE system. The present invention is directed toward satisfying the aforesaid need. In addition, the invention is to provide a method for measuring the INL of an AFE system by transferring from the output data of the AFE system rather than by accumulating the DNL. Further, the DNL of the AFE system is obtained by differentiating the INL. Therefore, the INL and DNL of the measured AFE system according to the invention both are only slightly affected by the accuracy of the inputted signal source slightly.

SUMMARY OF INVENTION

It is an objective of the invention to provide an improved method of measuring the DNL and INL of an AFE system, e.g., an analog/digital converter.

It is another objective of the invention to provide a method of measuring the DNL and INL of an AFE system that does not require well-calibrated equipment and a high-accuracy signal source.

It is another objective of the invention to provide a method of measuring the DNL and INL of an AFE system whereby the measurements are immune to D.C. drifts induced by the signal source and AFE system.

It is another objective of the invention to provide a method of measuring the DNL and INL of an AFE system whereby the measurements are affected slightly by the accuracy of inputted signal.

According to the invention, a method is provided for measuring an integral nonlinearity (INL) data and a differential nonlinearity (DNL) data of an analog front end (AFE) system corresponding to a predetermined ideal code. In a conversion of a signal by the AFE system, the signal is converted by the AFE system into N successive true codes at N corresponding successive coded steps. N successive ideal codes, based on to an ideal conversion of the signal by the AFE system, are computed at the N corresponding successive coded steps. Each of the N true codes includes a D.C. drift component contributed by a D.C. drift in the conversion, a signal component substantially contributed by the signal, a noise component contributed by a noise in the conversion and a harmonic distortion (HD) of the signal in the conversion. The N ideal codes includes the predetermined ideal code. The method is first to extract the noise component and HD component of each of the N true codes to obtain N error codes at the N coded steps. Afterwards, the method is to map each of the N error codes by one corresponding ideal code in accordance with the N coded steps. The method is then to average the error codes mapped by the predetermined ideal code to obtain the INL data. The method is then to differentiate the INL data with respect to the predetermined ideal code to obtain the DNL data. In the method, the noise and THD components, actually contributing the nonlinearity of the AFE system, are extracted, and then derived into the INL data. Afterwards, the DNL data is obtained by differentiating the INL data. Therefore, the method is implemented without the requisite of well-calibrated equipment. Moreover, the INL data and DNL data both are only slightly affected by the accuracy of the inputted signal:

The advantage and spirit of the invention may be understood by the following recitations together with the appended drawings.

BRIEF DESCRIPTION OF THE APPENDED DRAWINGS

DETAILED DESCRIPTION OF THE INVENTION

This present invention is to provide a method for measuring the INL and DNL of an AFE system such as an ADC. In general, the output of the AFE system can be distinguished into a signal component which represents the quantity substantially contributed by an inputted signal, a D.C. drift component which represents the quantity of D.C. drift in the output of the AFE system, a harmonic distortion component which represents the quantity of harmonic distortion induced by the AFE system, and a noise component which represents the quantity of noise. It is well known that the nonlinearity of the AFE system is substantially contributed by the harmonic distortion and noise components. In order to obtained the accurate nonlinearity of the AFE system, extraction of the harmonic distortion and noise components from the output of the AFE system is performed in the method according to the invention.

With respect to the investigation of a signal, there are two useful types of representations, i.e., time domain representation and frequency domain representation. By time domain representation, the digital output of the signal can be recorded easily. Otherwise, by frequency domain representation, a frequency spectrum analysis of the signal can be made, i.e., an actual signal spectrum and a noise spectrum from the analyzed signal can be separated from each other. Both types of representations are utilized in the method according to the invention.

Figure 1:
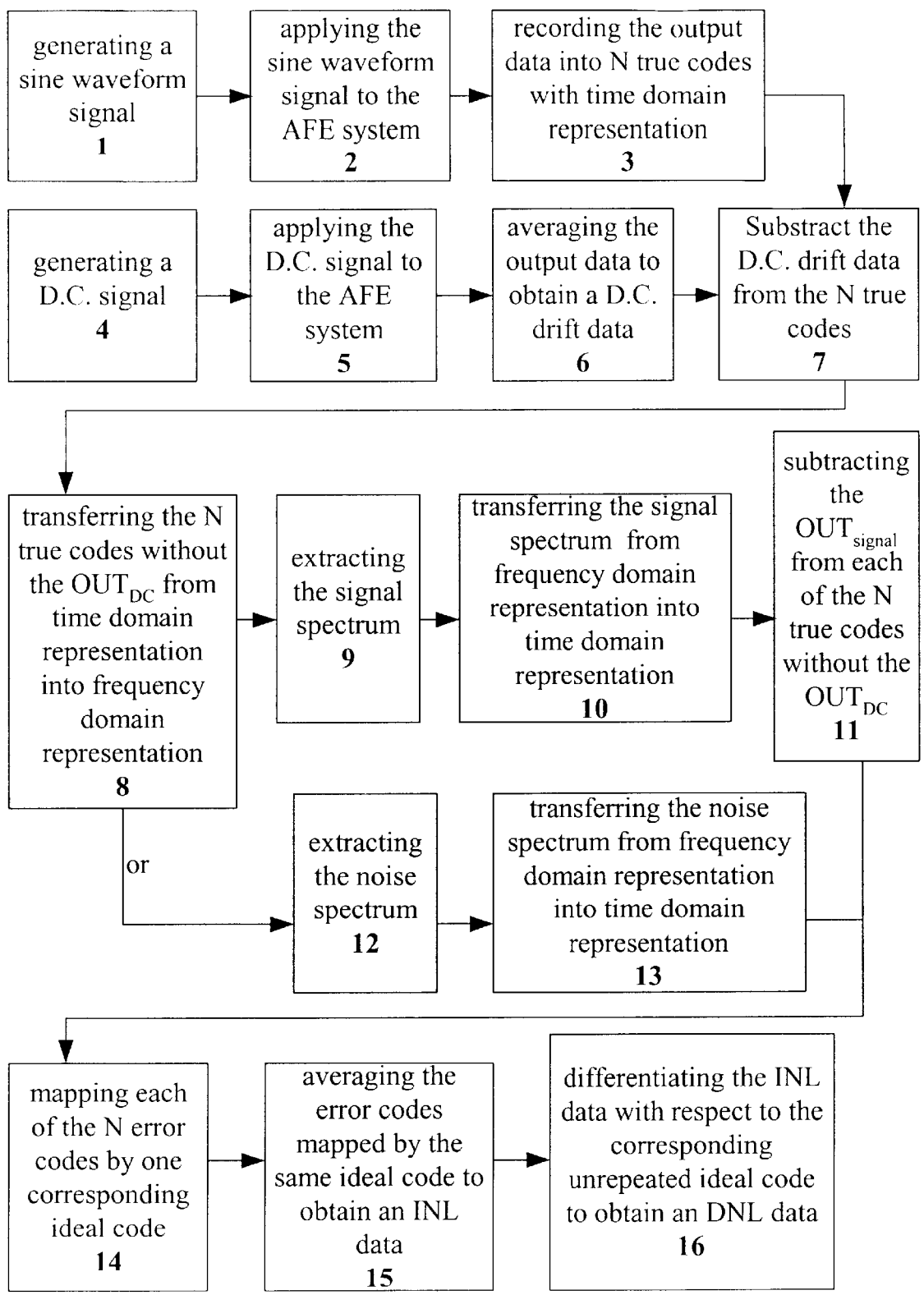
FIG. 1 is a flow chart illustrating a method of measuring the nonlinearity of an AFE system in accordance with the invention.

FIG. 1 is a flow chart illustrating the method according to the invention. Hereinafter, a 12-bits ADC in a scanner is taken as an example of the AFE system to illustrate the method according to the invention.

Typically, the ADC has an analog input and a digital output. The method utilizes a function generator to generate a sine waveform signal. The sine waveform signal is applied to the ADC. In general, a conversion characteristic of the ADC is represented by N successive coded steps at a predetermined sampling rate. In the invention, the output of the ADC is recorded into N successive true codes with time domain representation corresponding to the N successive coded steps, respectively. The steps aforementioned are illustrated from step 1 to step 3 in FIG. 1. In this case shown in FIG. 2, the output of the ADC is recorded at 32768 coded steps, i.e., the number of sampling points (N) is equal to 32768. It is noted that each of the N successive true codes includes a signal component ($OUT_{signal}$), a D.C. drift component ($OUT_{DC}$), a harmonic distortion component ($OUT_{HD}$) and a noise component ($OUT_{noise}$).

Based on an ideal conversion of the sine waveform signal by the ADC, N successive ideal codes are computed at the N corresponding successive coded steps. For the aforesaid case shown in FIG. 2, 32768 successive ideal codes are computed corresponding to 32768 successive codes steps.

After the A.C. switch of the function generator is turned off, a D.C. signal is applied from the function generator to the ADC for a duration. The output of the AFE system is acquired and averaged to obtain a D.C. drift data ($OUT_{DC}$) which is substantially induced by shift reference voltages of the function generator and/or the ADC. The aforesaid steps are illustrated from step 4 to step 6 in FIG. 1.

Figure 3:
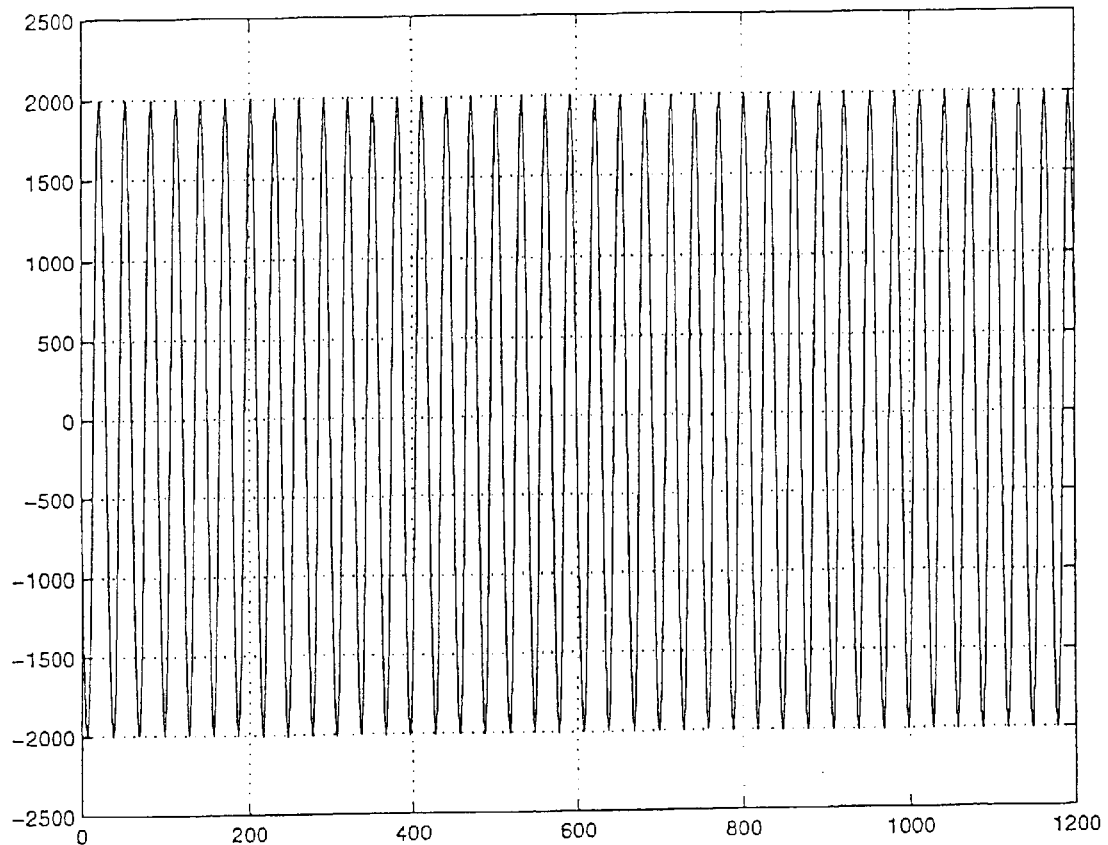
FIG. 3 is a zoom-in view showing the true codes of FIG. 2 without the D.C. drift components.

As illustrated in step 7 of FIG. 1, the D.C. drift data is subtracted from each of the N true codes, i.e., the $OUT_{DC}$ is subtracted from the output of the ADC. A zoom-in view of the N true codes without the $OUT_{DC}$ is shown in FIG. 3.

As illustrated in step 8 of FIG. 1, the N true codes are transferred from time domain representation into frequency domain representation. The details of the transferring step is determined by whether a coherent relationship exists between the frequency of the sine waveform signal and the sampling frequency of the ADC with respect to the N coded steps. The coherent relationship is defined as follow:

$$F_{signal} = F_{sampling} \times (M/N) \quad (1)$$

where $F_{signal}$ is the frequency of the sine waveform signal, $F_{sampling}$ is the sampling rate, and M is total cycle number of the sine waveform signal for measurement.

In the measurement, the phase difference between the starting point and the end point will induce an undesired D.C. drift. When the coherent relationship exists, the phase of the starting point of the measurement is equal to that of the end point of the measurement. By equation (1), the adequate $F_{signal}$, $F_{sampling}$, M and N can be chosen to minimize the D.C. drift induced by the phase difference. For example, the ideal $F_{signal}$=24414.0625 Hz can be chosen to minimize the D.C. drift induced by the phase difference when $F_{sampling}$=5 MHz, M=5 and N=1024. Under a coherent relationship, the transferring step is just a fast Fourier transformation (FFT) step. In practical application, $F_{signal}$=24414 Hz, close to the ideal $F_{signal}$=24414.0625 Hz, is made for the measurement easily when $F_{sampling}$=5 MHz, M=5 and N=1024. However, in the aforesaid case, the D.C. drift induced by the phase difference only contributes within 0.02% of the full INL, so it is negligible.

Figure 2A:
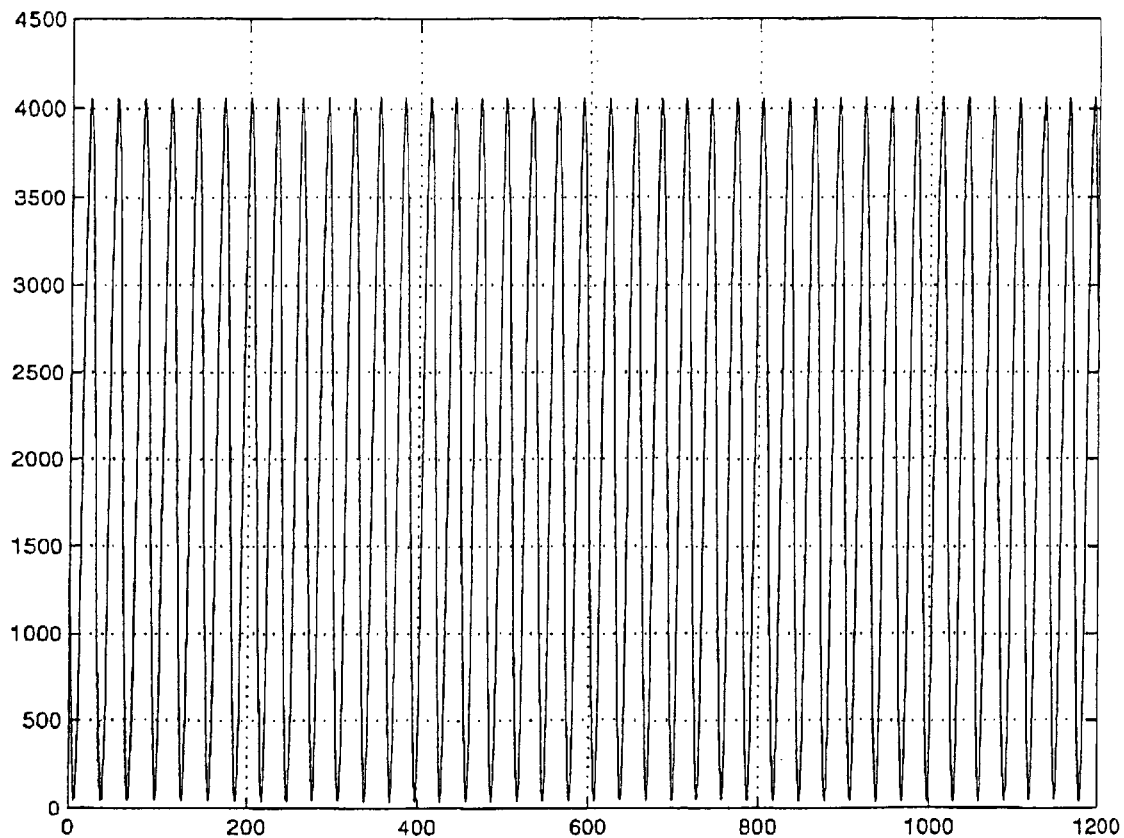
FIG. 2 shows the output of a 12-bits ADC applied by the sine waveform signal.
Figure 2B:
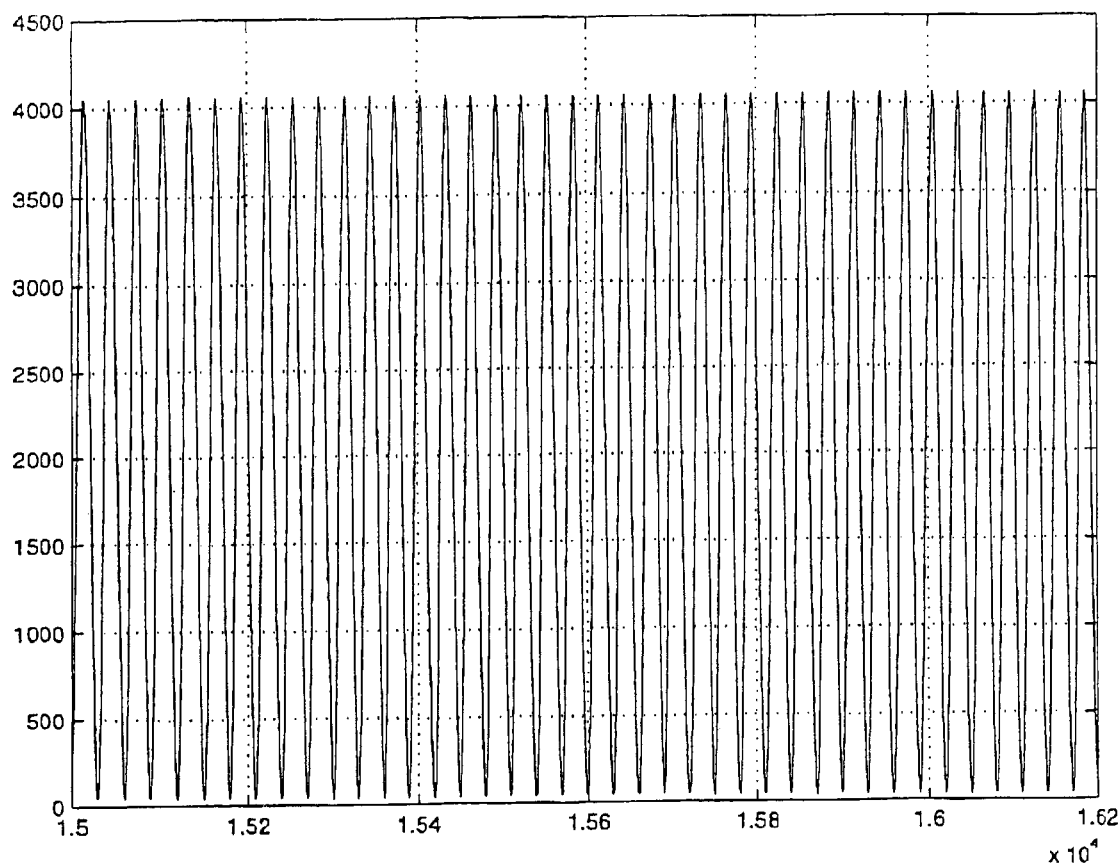
Figure 2C:
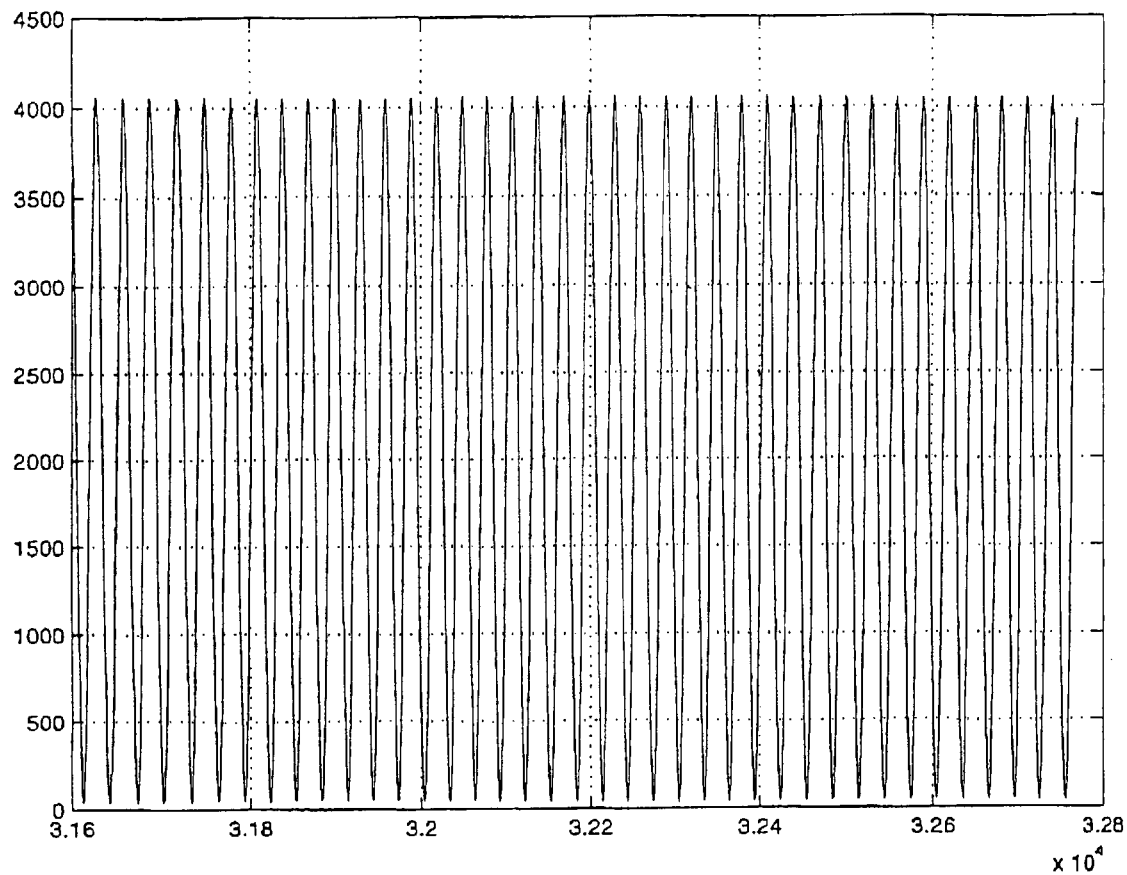
Figure 4:
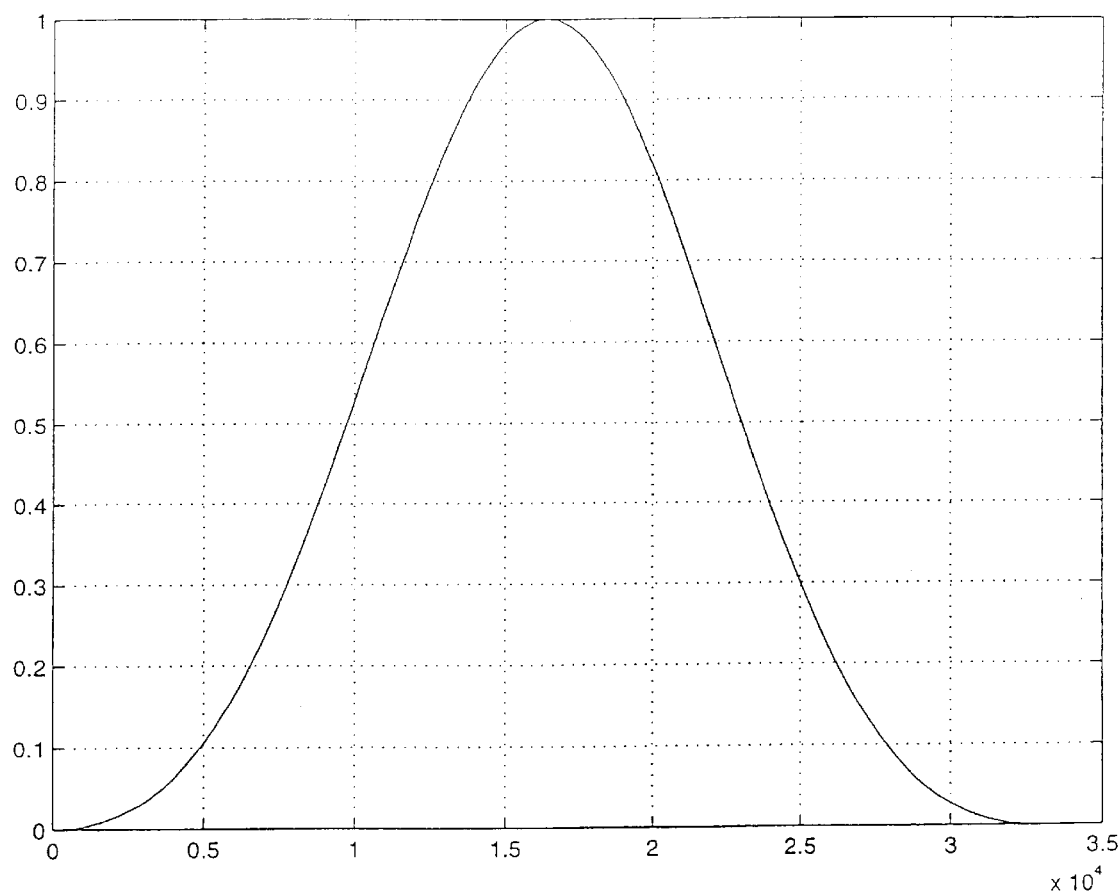
FIG. 4 shows the window function for windowing the data of FIG. 3.

When the coherent relationship does not exist, the phase of the starting point is not equal to that of the end point in the measurement. In this case, undesired D.C. drift is introduced into the measurements. To solve the problem mentioned above, a windowing step is required. Therefore, in this case, the transferring step includes a windowing step and an FFT step. The data shown in FIG. 2 is just an example where the coherent relationship does not exist. As shown in FIG. 4, it is a window function utilized for windowing the N true codes without the $OUT_{DC}$ whose zoom-in view is shown in FIG. 3. After the FFT transformation, the N true codes are transferred into frequency domain representation, as shown in FIG. 5.

Figure 5:
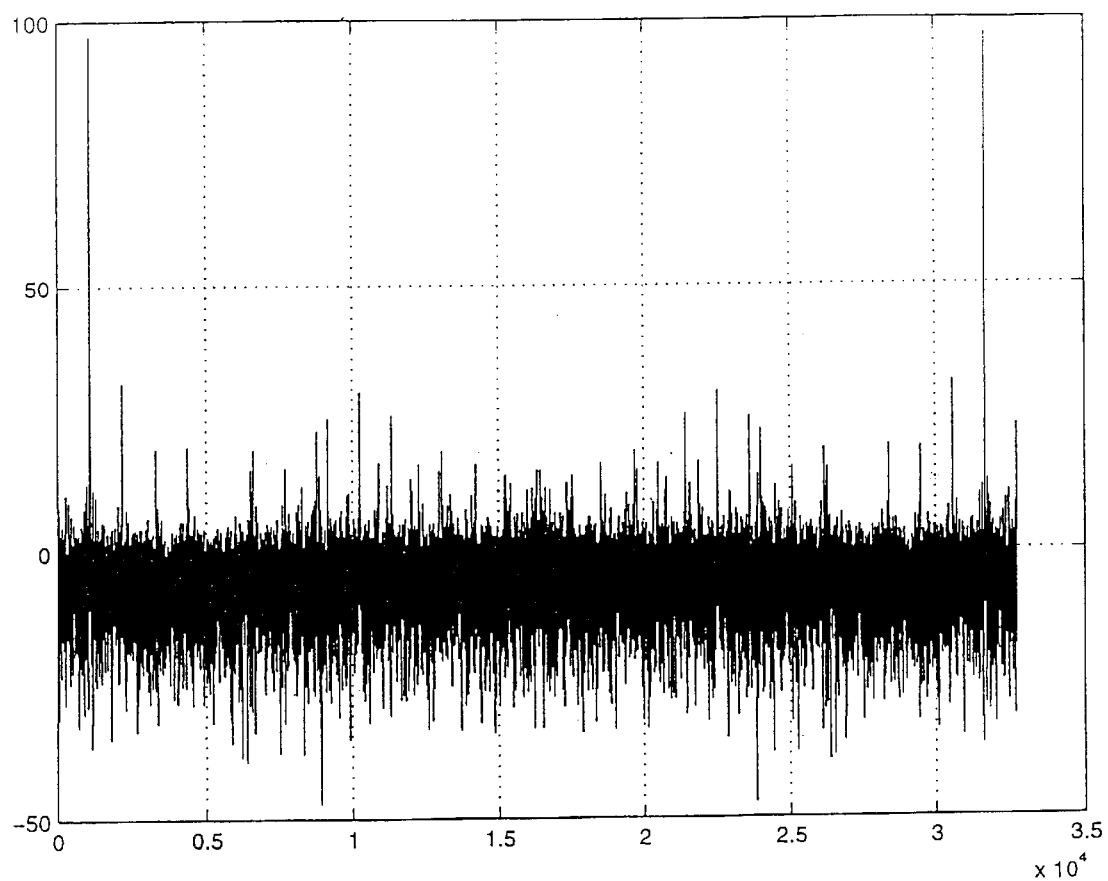
FIG. 5 shows the data of FIG. 3 after a transformation from time domain representation into frequency domain representation.
Figure 6:
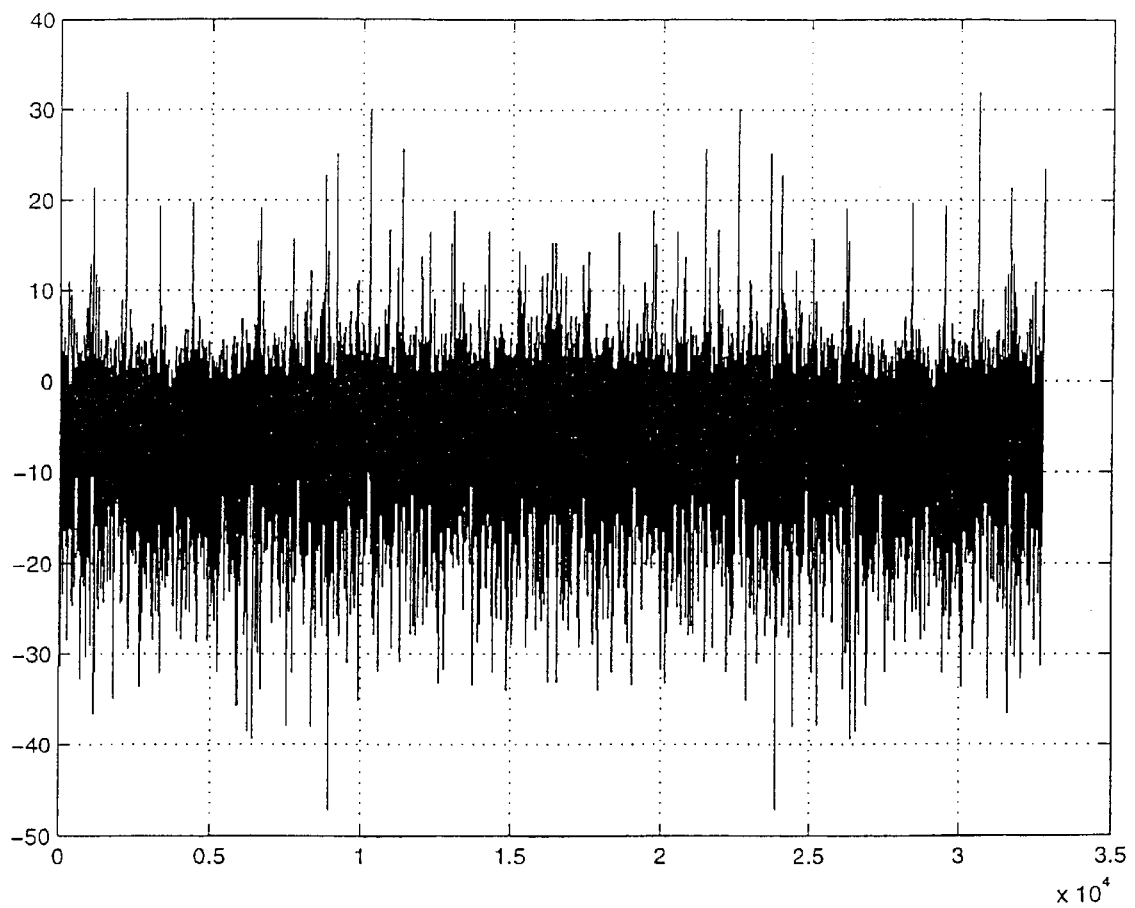
FIG. 6 shows the result of remaining noise in the frequency spectrum represented by FIG. 5.
Figure 7:
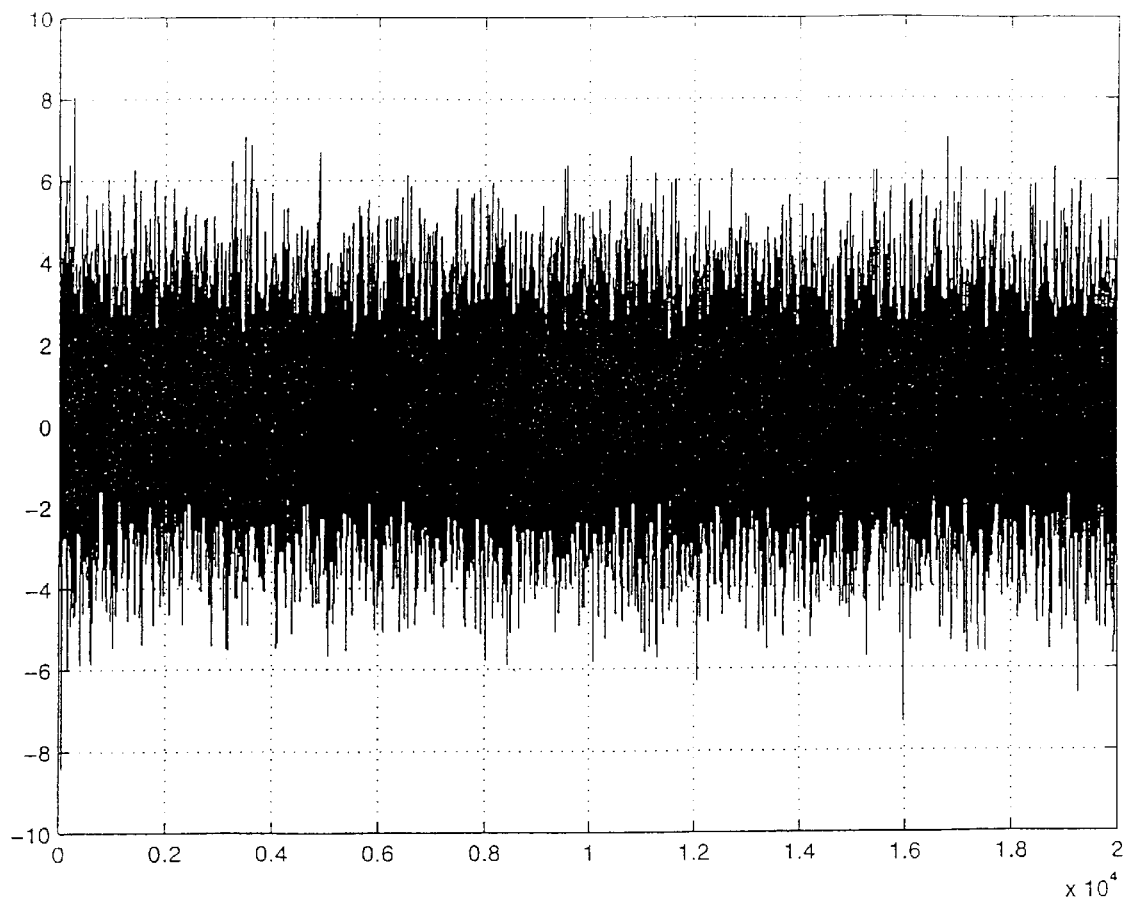
FIG. 7 shows the data of FIG. 6 after a transformation from frequency representation into time domain representation.

In FIG. 5, by frequency domain representation, a signal spectrum and a noise spectrum from the sine waveform signal can be distinguished from each other. The signal spectrum represents the $OUT_{signal}$ of the output of the ADC in frequency domain. The noise represents the quantity of the $OUT_{HD}$ and $OUT_{noise}$ of the output of the ADC in frequency domain. Based on an assumption that the noise on the signal spikes of the signal spectrum is equal to neighborhood, the signal spectrum can be filtered out and then the noise spectrum can be extracted, as shown in FIG. 6. Afterwards, the extracted noise spectrum is transferred from frequency domain representation into time domain representation to obtain N successive error codes corresponding to the N successive coded steps, respectively, as shown in FIG. 7. It is clear that the N error codes only include the $OUT_{noise}$ and $OUT_{HD}$ of the N true codes, i.e., the nonlinearity of the ADC can be derived from the N error codes. The steps aforesaid are illustrated from step 12 to step 13 in FIG. 1. Step 13 is an inverse FFT step when the coherent relationship mentioned above exists. Otherwise, step 13 includes an inverse windowing step and an inverse FFT step when the coherent relationship mentioned above does not exist. The extraction of the noise spectrum from the sine waveform signal would introduce undesired nonlinearity. However, the aforesaid nonlinearity usually contributes slight quantity to the INL, so it is negligible.

Alternatively, the noise spectrum in FIG. 5 is filtered out and only the signal bin is extracted. By transferring the extracted signal spectrum from frequency domain representation into time domain representation, the $OUT_{signal}$ can be obtained for the N true codes. Afterwards, by subtracting the $OUT_{signal}$ of the N successive true codes from the N successive true codes without the $OUT_{DC}$, N successive error codes contributed by the $OUT_{noise}$ and $OUT_{HD}$ of the N true codes can be obtained. The N error codes correspond to the N coded steps, respectively. The steps aforesaid are illustrated from step 9 to step 11 in FIG. 1. Step 10 is an inverse FFT step when the coherent relationship mentioned above exists. Otherwise, the step 10 includes an inverse windowing step and an inverse FFT step when the coherent relationship mentioned above does not exist.

Figure 8:
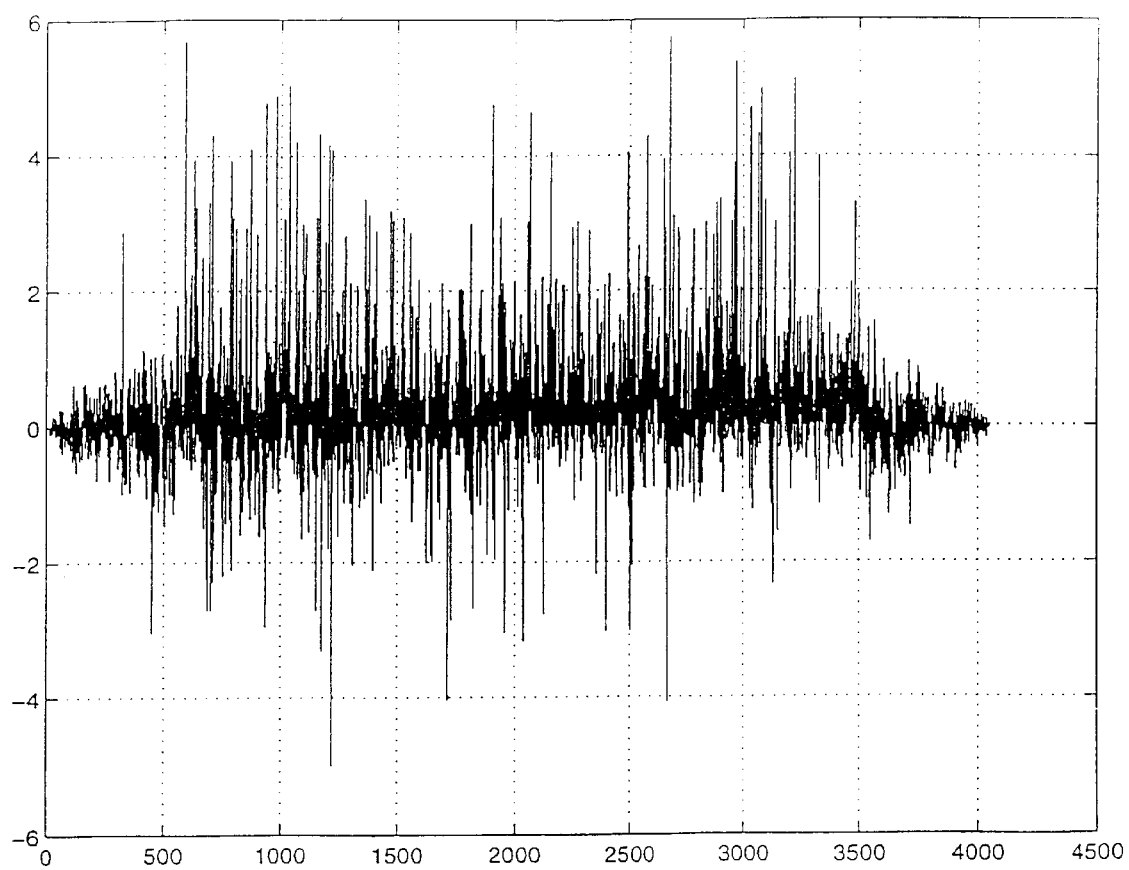
FIG. 8 shows the INL of the ADC vs. the corresponding ideal codes.
Figure 9:
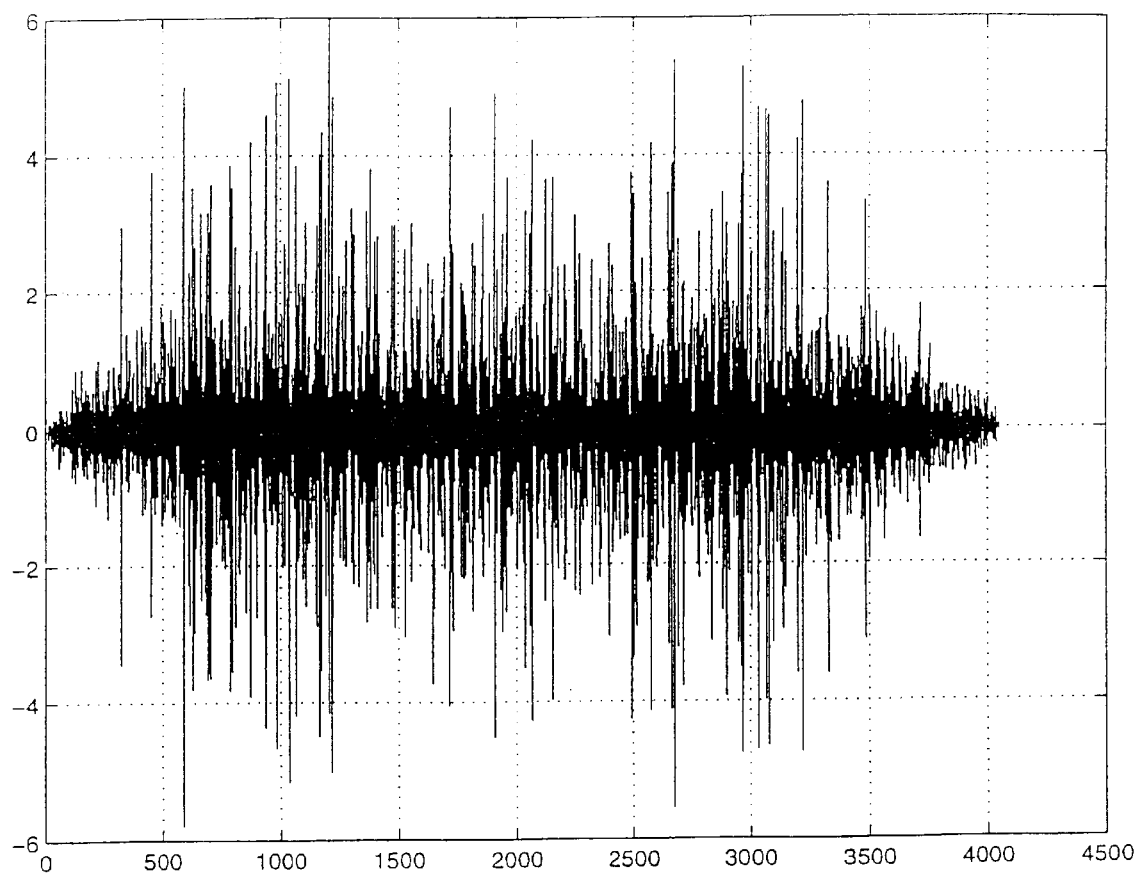
FIG. 9 shows the DNL of the ADC vs. the corresponding ideal codes.

Afterwards, each of the N error codes is mapped by one corresponding ideal code in accordance with the N coded steps. Because the N ideal codes all locate within the full scale of resolution of the ADC (AFE system). Therefore, one ideal code may be found repeatedly in the N ideal codes. The N ideal codes can be summarized into a sequence of unrepeated ideal codes. To obtain an INL data corresponding to a predetermined ideal code included in the unrepeated ideal codes, all of the error codes mapped by the predetermined ideal code are averaged. By the aforementioned method, the unrepeated ideal codes vs. their corresponding INL data are rearranged and shown in FIG. 8. It is noted that the scale of X-axis in FIG. 8 represents the full scale of resolution of the 12-bits ADC, i.e., the maximum scale of X-axis is equal to 4096. By differentiating the INL data with respect to the corresponding unrepeated ideal code, a DNL data of the corresponding unrepeated ideal code is obtained. The aforesaid steps are illustrated from step 14 to step 16. A simple method for deriving the DNL(i) data of the ith ideal code existing in the unrepeated ideal codes is by subtracting the INL(i-1) from INL(i) data. Utilizing the aforementioned method, the result of the DNL data vs. the unrepeated ideal codes derived from the data of FIG. 8 is shown in FIG. 9.

Differing from the conventional methods, the INL of an AFE system is generated from measured data by the method according to the invention. Therefore, the accuracy of the INL is permissible. Moreover, the DNL of the AFE system is obtained by differentiating the INL such that the accuracy of DNL is in the same order as that of the INL and is also permissible.

Also differing from the conventional method, the component induced by the D.C. drift is eliminated from the INL and DNL by the method according to invention. Therefore, the method is implemented without the requisite of well-calibrated equipment.

While the invention has been described in one presently preferred embodiment, it is understood that the words which have been used are words of description rather than words of limitation and that changes within the purview of the appended claims may be made without departing from the scope and spirit of the invention in its broader aspect.

What is claimed is:

1. In a conversion of a signal by an analog front end (AFE) system, the signal being converted into N successive true codes at N corresponding successive coded steps, N successive ideal codes, based on an ideal conversion of the signal by the AFE system, being computed at the N corresponding successive coded steps, each of the N true codes including a D.C. drift component contributed by a D.C. drift in the conversion, a signal component substantially contributed by the signal, a noise component contributed by a noise in the conversion and a harmonic distortion (HD) of the signal in the conversion, the N ideal codes including a predetermined ideal code, a method for measuring an integral nonlinearity (INL) data and a differential nonlinearity (DNL) data of the AFE system corresponding to the predetermined ideal code comprising the steps of:

extracting the noise component and HD component of each of the N true codes to obtain N error codes at the N coded steps;

mapping each of the N error codes by one corresponding ideal code in accordance with the N coded steps;

averaging the error codes mapped by the predetermined ideal code to obtain the INL data;

differentiating the INL data with respect to the predetermined ideal code to obtain the DNL data.

2. The method of claim 1, wherein the signal is generated by a function generator, and wherein the D.C. drift component is obtained by applying a D.C. signal of the function generator to the AFE system for a duration after an A.C. switch of the function generator is turned off and also by averaging the output of the AFE system.

3. The method of claim 2, wherein the step of extracting the noise and HD components comprises the steps of:

representing the N true codes in time domain;

subtracting the D.C. drift component from each of the N true codes;

transferring the N true codes without the D.C drift component from time domain representation into frequency domain representation to distinguish a signal spectrum and a noise spectrum;

extracting the noise spectrum to obtain the N error codes with frequency domain representation;

transferring the N error codes from frequency domain representation into time domain representation.

4. The method of claim 3, wherein the frequency of the signal has a coherent relationship with a sampling rate of the AFE system with respect to the N coded steps.

5. The method of claim 4, wherein the coherent relationship is described by the following equation:

$$F_{signal} = F_{sampling} \times (M/N)$$

where $F_{signal}$ is the frequency of the sine waveform signal, $F_{sampling}$ is the sampling rate, and M is the cycle number of the sine waveform signal for measurement.

6. The method of claim 5, wherein the step of transferring the N true codes without the D.C drift component from time domain representation into frequency domain representation comprises a fast Fourier transformation (FFT) step, and wherein the step of transferring the N error codes from frequency domain representation into time domain representation comprises an inverse FFT step.

7. The method of claim 6, wherein the signal is a sine waveform signal.

8. The method of claim 7, wherein the AFE system is an analog/digital converter.

9. The method of claim 3, wherein the frequency of the sine waveform signal has an incoherent relationship with a sampling rate of said AFE system with respect to the N coded steps.

10. The method of claim 9, wherein the incoherent relationship is described by the following equation:

$$F_{signal} \neq F_{sampling} \times (M/N)$$

where $F_{signal}$ is the frequency of the sine waveform signal, $F_{sampling}$ is the sampling rate, and M is the cycle number of the sine waveform signal for measurement.

11. The method of claim 10, wherein the step of transferring the N true codes without the D.C drift component from time domain representation into frequency domain representation comprises a fast Fourier transformation (FFT) step and a windowing step, and wherein the step of transferring the N error codes from frequency domain representation into time domain representation comprises an inverse windowing step and an inverse FFT step.

12. The method of claim 11, wherein the signal is a sine waveform signal.

13. The method of claim 12, wherein the AFE system is an analog/digital converter.

14. The method of claim 2, wherein the step of extracting the noise and HD components comprises the steps of:
   representing the N true codes in time domain;
   subtracting the D.C. drift component from each of the N true codes;
   transferring the N true codes without the D.C drift component from time domain representation into frequency domain representation to distinguish a signal spectrum and a noise spectrum;
   extracting the signal spectrum;
   transferring the signal spectrum into time domain representation to obtain the signal component for each of the N true codes;
   subtracting the signal component from each of the N true codes without the D.C. drift component to obtain the N error codes.

15. The method of claim 14, wherein the frequency of the signal has a coherent relationship with a sampling rate of the AFE system with respect to the N coded steps.

16. The method of claim 15, wherein the coherent relationship is described by the following equation:

$$F_{signal} = F_{sampling} \times (M/N)$$

where $F_{signal}$ is the frequency of the sine waveform signal, $F_{sampling}$ is the sampling rate, and M is the cycle number of the sine waveform signal for measurement.

17. The method of claim 16, wherein the step of transferring the N true codes without the D.C drift component from time domain representation into frequency domain representation comprises a fast Fourier transformation (FFT) step, and wherein the step of transferring the signal spectrum into time domain representation comprises an inverse FFT step.

18. The method of claim 17, wherein the signal is a sine waveform signal.

19. The method of claim 18, wherein the AFE system is an analog/digital converter.

20. The method of claim 14, wherein the frequency of the sine waveform signal has an incoherent relationship with a sampling rate of said AFE system with respect to the N coded steps.

21. The method of claim 20, wherein the incoherent relationship is described by the following equation:

$$F_{signal} \neq F_{sampling} \times (M/N)$$

where $F_{signal}$ is the frequency of the sine waveform signal, $F_{sampling}$ is the sampling rate, and M is the cycle number of the sine waveform signal for measurement.

22. The method of claim 21, wherein the step of transferring the N true codes without the D.C drift component from time domain representation into frequency domain representation comprises a fast Fourier transformation (FFT) step and a windowing step, and wherein the step of transferring the signal spectrum into time domain representation comprises an inverse windowing step and an inverse FFT step.

23. The method of claim 22, wherein the signal is a sine waveform signal.

24. The method of claim 23, wherein the AFE system is an analog/digital converter.

25. A method for measuring an integral nonlinearity (INL) data and an differential nonlinearity (DNL) data of an analogy front end (AFE) system, said AFE system having an analog input, a digital output, a sine waveform signal being converted by the AFE system at N successive coded steps, N successive ideal codes, based on an ideal conversion of the signal by the AFE system, being computed at the N corresponding successive coded steps, the N ideal codes including a predetermined ideal code, the INL data and DNL data corresponding to the predetermined ideal code, said method comprising the steps of:
   generating the sine waveform signal by a function generator;
   applying the sine waveform signal to said AFE system, and recording the output of the AFE system into N successive true codes with time domain representation at the N corresponding successive coded steps;
   applying a D.C. signal of the function generator to the AFE system for a duration after an A.C. switch of the function generator is turned off, and averaging the output of said AFE system to obtain a D.C. drift data;
   subtracting the D.C. drift data from each of the N true codes;
   transferring the N true codes without the D.C drift data from time domain representation into frequency domain representation to distinguish a signal spectrum and a noise spectrum;
   extracting the noise spectrum;
   transferring the noise spectrum into time domain representation to obtain N error codes at the N coded steps;
   mapping each of the N error codes by one corresponding ideal code in accordance with the N coded steps;
   averaging the error codes mapped by the predetermined ideal code to obtain the INL;
   differentiating the INL data with respect to the predetermined ideal code to obtain the DNL data.

26. The method of claim 25, wherein the frequency of the sine waveform signal has a coherent relationship with a sampling rate of the AFE system with respect to the N coded steps.

27. The method of claim 26, wherein the coherent relationship is described by the following equation:

$$F_{signal} = F_{sampling} \times (M/N)$$

where $F_{signal}$ is the frequency of the sine waveform signal, $F_{sampling}$ is the sampling rate, and M is the cycle number of the sine waveform signal for measurement.

28. The method of claim 27, wherein the step of transferring the N true codes without the D.C drift data from time domain representation into frequency domain representation comprises a fast Fourier transformation (FFT) step, and wherein the step of transferring the noise spectrum into time domain representation comprises an inverse FFT step.

29. The method of claim 28, wherein the AFE system is an analog/digital converter.

30. The method of claim 25, wherein the frequency of the sine waveform signal has an incoherent relationship with a sampling rate of the AFE system with respect to the N coded steps.

31. The method of claim 30, wherein the incoherent relationship is described by the following equation:

$$F_{signal} \neq F_{sampling} \times (M/N)$$

where $F_{signal}$ is the frequency of the sine waveform signal, $F_{sampling}$ is the sampling rate, and M is the cycle number of the sine waveform signal for measurement.

32. The method of claim 31, wherein the step of transferring the N true codes without the D.C drift data from time domain representation into frequency domain representation comprises a fast Fourier transformation (FFT) step and a windowing step, and wherein the step of transferring the noise spectrum into time domain representation comprises an inverse windowing step and an inverse FFT step.

33. The method of claim 32, wherein the AFE system is an analog/digital converter.

34. A method for measuring an integral nonlinearity (INL) data and an differential nonlinearity (DNL) data of an analogy front end (AFE) system, said AFE system having an analog input, a digital output, a sine waveform signal being converted by the AFE system at N successive coded steps, N successive ideal codes, based on an ideal conversion of the signal by the AFE system, being computed at the N corresponding successive coded steps, the N ideal codes including a predetermined ideal code, the INL data and DNL data corresponding to the predetermined ideal code, said method comprising the steps of:

generating the sine waveform signal by a function generator;

applying the sine waveform signal to the AFE system, and recording the output of said AFE system into N successive true codes with time domain representation at the N corresponding successive coded steps;

applying a D.C. signal of the function generator to the AFE system for a duration after an A.C. switch of the function generator is turned off, and averaging the output of said AFE system to obtain a D.C. drift data;

subtracting the D.C. drift data from each of the N true codes;

transferring the N true codes without the D.C. drift data from time domain representation into frequency domain representation to distinguish a signal spectrum and a noise spectrum;

extracting the signal spectrum;

transferring the signal spectrum into time domain representation to obtain a signal component substantially contributed by the sine waveform signal for each of the N true codes;

subtracting the signal component from each of the N true codes without the D.C drift data to obtain N error codes at the N coded steps;

mapping each of the N error codes by one corresponding ideal code in accordance with the N coded steps;

averaging the error codes mapped by the predetermined ideal code to obtain the INL data;

differentiating the INL data with respect to the predetermined ideal code to obtain the DNL data.

35. The method of claim 34, wherein the frequency of the sine waveform signal has a coherent relationship with a sampling rate of the AFE system with respect to the N coded steps.

36. The method of claim 35, wherein the coherent relationship is described by the following equation:

$$F_{signal} = F_{sampling} \times (M/N)$$

where $F_{signal}$ is the frequency of the sine waveform signal, $F_{sampling}$ is the sampling rate, and M is the cycle number of the sine waveform signal for measurement.

37. The method of claim 36, wherein the step of transferring the N true codes without the D.C. drift data from time domain representation into frequency domain representation comprises a fast Fourier transformation (FFT) step, and wherein the step of transferring the signal spectrum into time domain representation comprises an inverse FFT step.

38. The method of claim 37, wherein said AFE system is an analog/digital converter.

39. The method of claim 34, wherein the frequency of the sine waveform signal has an incoherent relationship with a sampling rate of the AFE system with respect to the N coded steps.

40. The method of claim 39, wherein the incoherent relationship is described by the following equation:

$$F_{signal} \neq F_{sampling} \times (M/N)$$

where $F_{signal}$ is the frequency of the sine waveform signal, $F_{sampling}$ is the sampling rate, and M is the cycle number of the sine waveform signal for measurement.

41. The method of claim 40, wherein the step of transferring the N true codes without the D.C. drift data from time domain representation into frequency domain representation comprises a fast Fourier transformation (FFT) step and a windowing step, and wherein the step of transferring the signal spectrum into time domain representation comprises an inverse windowing step and an inverse FFT step.

42. The method of claim 41, wherein the AFE system is an analog/digital converter.

* * * * *